United States Patent
Sako et al.

(10) Patent No.: US 8,378,752 B2
(45) Date of Patent: Feb. 19, 2013

(54) OSCILLATOR CIRCUIT

(75) Inventors: Kazutoshi Sako, Kanagawa (JP); Tomokazu Matsuzaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 25 days.

(21) Appl. No.: 13/078,446

(22) Filed: Apr. 1, 2011

(65) Prior Publication Data

US 2011/0248786 A1    Oct. 13, 2011

(30) Foreign Application Priority Data

Apr. 12, 2010   (JP) .................................. 2010-091286

(51) Int. Cl.
*H03L 7/085* (2006.01)

(52) U.S. Cl. ............................. 331/17; 331/34; 331/143

(58) Field of Classification Search .................. 331/1 R, 331/16, 17, 34, 74, 111, 143, 177 R
See application file for complete search history.

(56) References Cited

U.S. PATENT DOCUMENTS

| | | | |
|---|---|---|---|
| 4,131,862 A * | 12/1978 | Black et al. | 331/4 |
| 5,594,388 A | 1/1997 | O'Shaughnessy et al. | |
| 5,982,241 A * | 11/1999 | Nguyen et al. | 331/49 |
| 5,994,967 A * | 11/1999 | Nguyen | 331/1 R |
| 6,342,817 B1 * | 1/2002 | Crofts et al. | 331/1 R |

\* cited by examiner

*Primary Examiner* — Levi Gannon
(74) *Attorney, Agent, or Firm* — Foley & Lardner LLP (57) ABSTRACT

An oscillator circuit in accordance with an aspect of the present invention includes a filter capacitor that generates an oscillating frequency control voltage according to a charge amount accumulated based on an oscillating frequency setting current, an oscillator that changes a frequency of an oscillation signal to be output according to the oscillating frequency control voltage, a control circuit that generates a timing control signal, a frequency detection circuit that generates a frequency detection voltage based on the timing control signal, a voltage level of the frequency detection voltage being changed according to a length of the period of the oscillation signal, and a differential amplifier that continuously changes the oscillating frequency setting current according to a voltage difference between the frequency detection voltage and a reference voltage, and outputs the resultant oscillating frequency setting current to the filter capacitor.

19 Claims, 9 Drawing Sheets

OSCILLATOR CIRCUIT

CROSS-REFERENCE TO RELATED APPLICATIONS

This application is based upon and claims the benefit of priority from Japanese patent application No. 2010-091286, filed on Apr. 12, 2010, the disclosure of which is incorporated herein in its entirety by reference.

BACKGROUND

The present invention relates to an oscillator circuit, in particular an oscillator circuit of which the oscillating frequency is set by a resistor and a capacitor.

In the application fields of microcomputers, systems have become so complicated that a plurality of microcomputer chips communicate with each other to form one system. Such systems require high-precision reference clocks (e.g., clock signals having no or small jitter) for communication between microcomputer chips. In general, to generate high-precision reference clocks, external components such as quartz oscillators or ceramic oscillators, whose oscillating frequency is substantially unchanged regardless of changes in the environment such as temperature are used. On the other hand, it has been desired to reduce the number of necessary components in order to reduce the total cost of systems and/or to reduce the packaging area.

As a result, it has been proposed to incorporate an oscillator circuit that generates a reference clock into a semiconductor device as a way of reducing the number of external components. As an oscillator circuit embedded in a semiconductor device, an RC oscillator circuit of which the oscillating frequency is set by a resistor and a capacitor is used. Since resistors and capacitors can be easily embedded in semiconductor devices, RC oscillator circuits can generate relatively high-precision clock signals.

Figure 9:
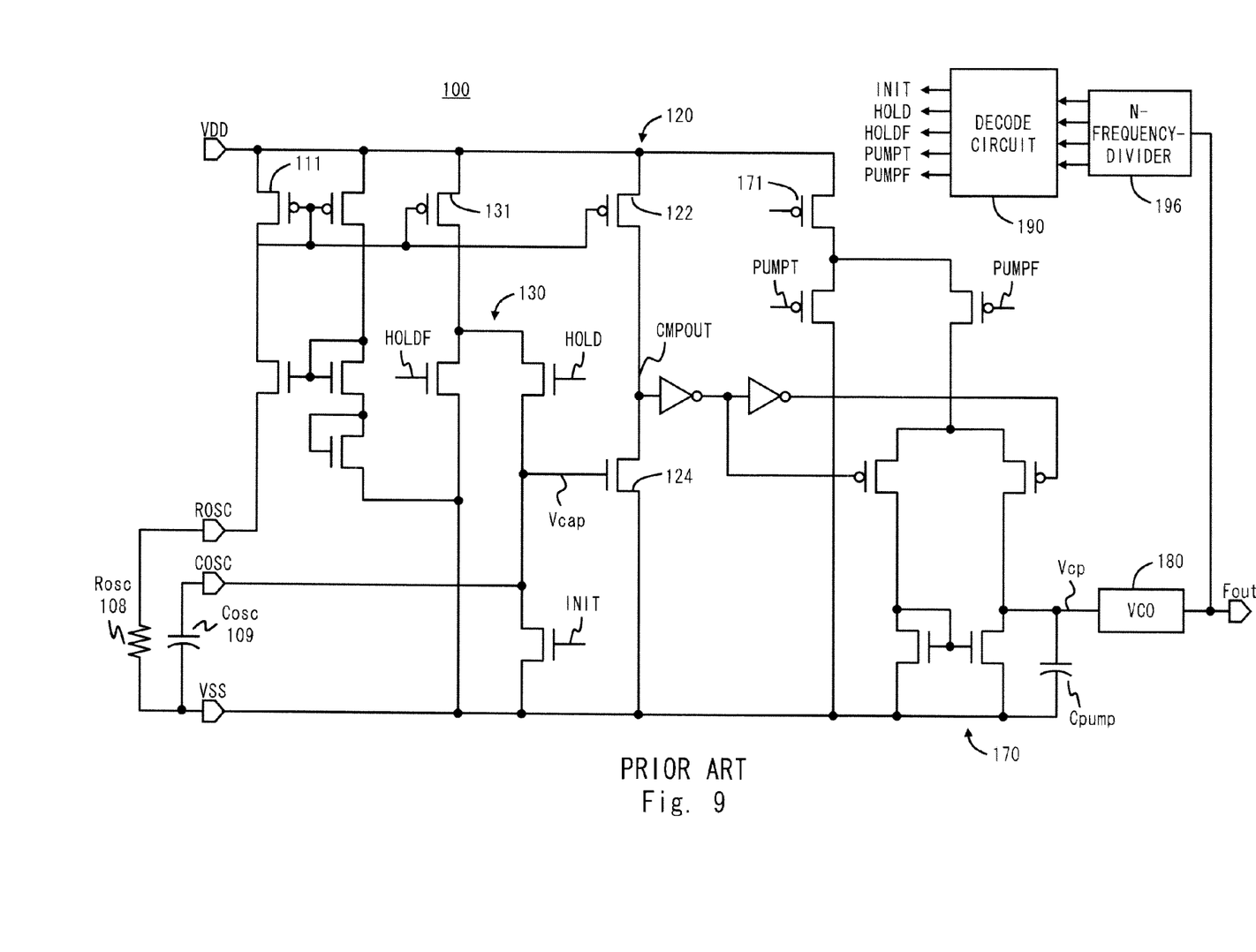
FIG. 9 is a circuit diagram of an oscillation signal disclosed in U.S. Pat. No. 5,594,388.

U.S. Pat. No. 5,594,388 discloses an example of such oscillator circuits. Therefore, FIG. 9 shows the circuit diagram of an oscillator circuit 100 disclosed in U.S. Pat. No. 5,594,388. The oscillator circuit 100 forms an RC oscillator circuit by using a resistor Rosc108 and a capacitor Cosc109 as base elements. In the oscillator circuit 100, a current Iosc flowing through the resistor Rosc108 is supplied to a ramp-and-hold circuit 130 through a current mirror circuit composed of transistors 111 and 131. Then, the ramp-and-hold circuit 130 charges the capacitor Cosc109 with the current Iosc. In this process, a comparator 120 compares a current that flows to a transistor 124 based on a voltage Vcap generated by the capacitor Cosc with a current that flows to a transistor 122 based on a voltage generated by the resistor Rosc. Then, the direction of the charge/discharge of a capacitor Cpump is determined by a charge pump circuit 170 according to the output of the comparator 120. In this way, an oscillating frequency control voltage Vcp is generated at a node connected to the capacitor Cpump. Then, a voltage control oscillator 180 changes the oscillating frequency of an output signal bout according to the oscillating frequency control voltage Vcp.

Incidentally, in the oscillator circuit 100, the frequency of the output signal output from the voltage control oscillator 180 can be divided by a frequency-dividing circuit 196. Therefore, in the oscillator circuit 100, the comparator 120, and the charge pump circuit 170 are operated at 1/N of the frequency of the output signal.

As described above, in the oscillator circuit 100, instead of using the output of the comparator 120 as the output signal, the charge pump circuit 170 and the voltage control oscillator 180 are controlled based on the output of the comparator 120. By doing so, the oscillating frequency of the output signal can be increased irrespective of the delay time of the comparator 120.

SUMMARY

The present inventors have found the following problem. In the oscillator circuit 100, the current value of the current used to charge/discharge the capacitor Cpump is determined by the transistor 171 and the charge pump circuit. If the capacitance of the capacitor Cpump is sufficiently large and the current flowing to the transistor 171 is small, the oscillating frequency control voltage Vcp is averaged and thereby becomes substantially constant. However, when the capacitor Cpump is large and the current flowing to the transistor 171 is small, the gain of the system becomes smaller and the locking of the frequency is thereby delayed. On the other hand, by increasing the current flowing to the transistor 171 and reducing the capacitance of the capacitor Cpump, the locking of the frequency becomes faster. However, in this case, the change in the oscillating frequency control voltage Vcp becomes larger. As a result, noticeable jitter appears in the output signal of the voltage control oscillator 180. As described above, the oscillator circuit 100 disclosed in U.S. Pat. No. 5,594,388 suffers from the problem that the accuracy of the output signal is low.

A first aspect of the present invention is an oscillator circuit including: a filter capacitor that generates an oscillating frequency control voltage according to a charge amount accumulated based on an oscillating frequency setting current; an oscillator that changes a frequency of an oscillation signal to be output according to the oscillating frequency control voltage; a control circuit that generates a timing control signal, a logic level of the timing control signal being switched based on a period of the oscillation signal; a frequency detection circuit that generates a frequency detection voltage based on the timing control signal, a voltage level of the frequency detection voltage being changed according to a length of the period of the oscillation signal; and a differential amplifier that continuously changes the oscillating frequency setting current according to a voltage difference between the frequency detection voltage and a reference voltage, and outputs the resultant oscillating frequency setting current to the filter capacitor.

The oscillator circuit in accordance with an aspect of the present invention includes a differential amplifier that continuously changes the oscillating frequency setting current according to a voltage difference between the frequency detection voltage whose voltage level changes according to the length of the period of the oscillation signal and the reference voltage, and outputs the resultant oscillating frequency setting current to the filter capacitor. In this way, the oscillator circuit in accordance with an aspect of the present invention can make the oscillating frequency detection voltage converge to a predetermined voltage value.

In accordance with the oscillator circuit according to an aspect of the present invention, it is possible to lower the jitter of the oscillating frequency and thereby improve the accuracy of the oscillation signal.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
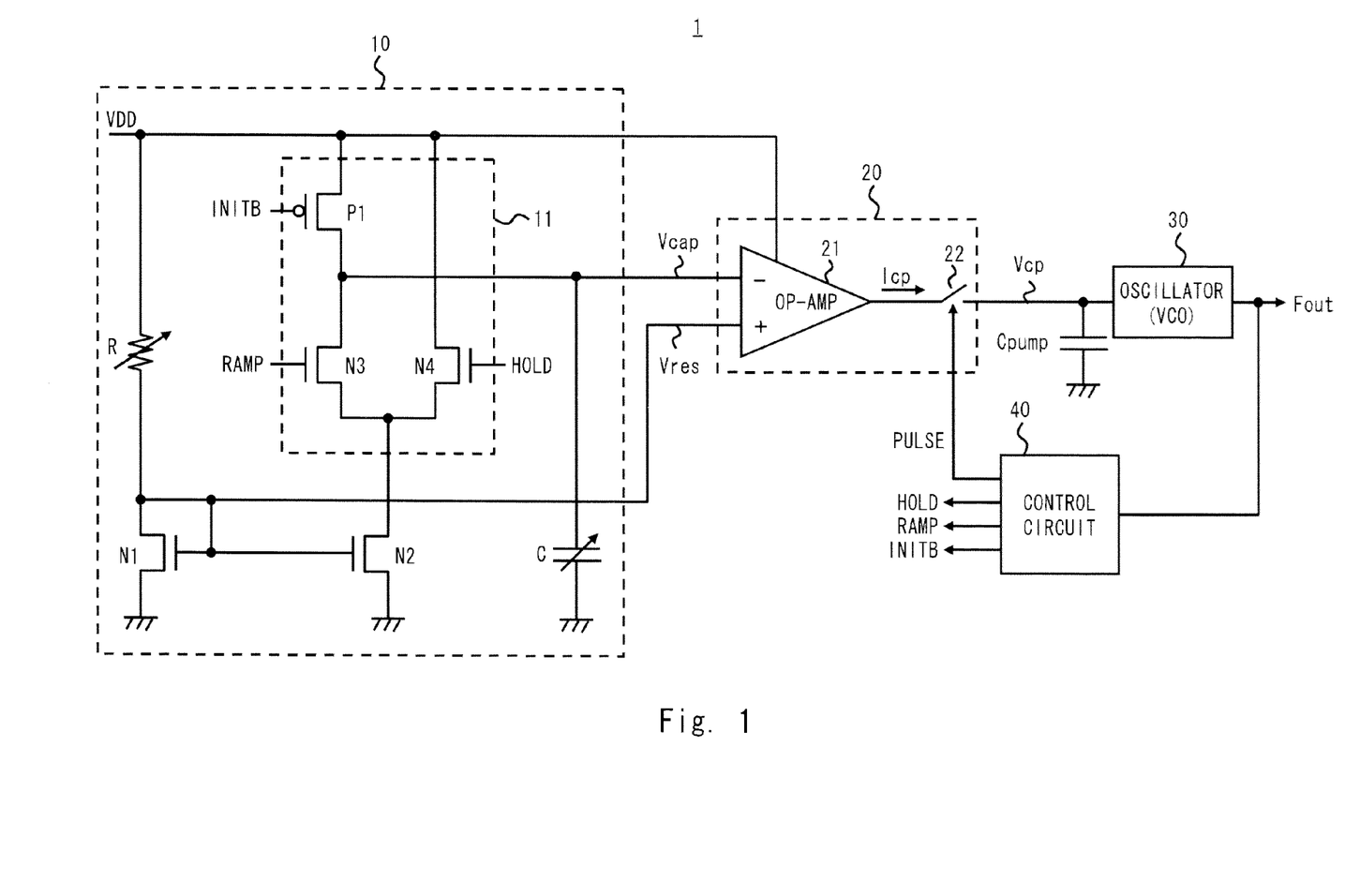
FIG. 1 is a block diagram of an oscillator circuit in accordance with a first embodiment of the present invention.

Embodiments of the present invention are explained hereinafter with reference to the drawings. FIG. 1 shows a block diagram of an oscillator circuit 1 in accordance with a first embodiment of the present invention. As shown in FIG. 1, the oscillator circuit 1 includes a frequency detection circuit 10, a differential amplifier 20, an oscillator 30 (e.g., voltage control oscillator), a control circuit 40, and a filter capacitor Cpump.

The frequency detection circuit 10 generates a frequency detection voltage Vcap based on timing control signals output by the control circuit 40, a voltage level of the frequency detection voltage Vcap changes according to the length of the period of an oscillation signal (hereinafter referred to as "output signal Fout"). Note that the timing control signals includes a charge reset signal INITB, a ramp control signal RAMP, and a hold control signal HOLD, and the frequency detection circuit 10 generates the frequency detection voltage Vcap according to these signals.

As shown in FIG. 1, the frequency detection circuit 10 includes a ramp-and-hold circuit 11, NMOS transistors N1 and N2, a frequency setting resistor R, and a frequency setting capacitor C. One end of the frequency setting resistor R is connected to a power-supply terminal VDD and the other end is connected to the drain of the NMOS transistor N1. The gate and the drain of the NMOS transistor N1 are connected to each other. Further, the source of the NMOS transistor N1 is connected to a ground terminal. The gate of the NMOS transistor N2 is connected to the gate of the NMOS transistor N1, and the source of the NMOS transistor N2 is connected to the ground terminal. Further, the drain of the NMOS transistor N2 is connected to the ramp-and-hold circuit 11. That is, the current value of the charge/discharge current is determined by a difference voltage between a diode voltage generated by the NMOS transistor N1 and the power-supply voltage and the resistance value of the frequency setting resistor R. Then, this charge/discharge current is supplied to the ramp-and-hold circuit 11 through a current mirror circuit composed of the NMOS transistors N1 and N2.

The ramp-and-hold circuit 11 supplies the charge/discharge current to the frequency setting capacitor C and resets the charge accumulated in the frequency setting capacitor C based on the timing control signals. The ramp-and-hold circuit 11 includes NMOS transistors N3 and N4 and a PMOS transistor P1. The NMOS transistors N3 and N4 form a differential pair. That is, the sources of the NMOS transistors N3 and N4 are connected to each other. Further, the charge/discharge current output from the drain of the NMOS transistor N2 is supplied to the sources (common connection point) of the NMOS transistors N3 and N4. The ramp control signal RAMP is input to the gate of the NMOS transistor N3 and the hold control signal HOLD is input to the gate of the NMOS transistor N4. The drain of the NMOS transistor N3 is connected to the drain of the PMOS transistor P1, and the connection point serves as the output terminal of the ramp-and-hold circuit 11. The drain of the NMOS transistor N4 is connected to the power-supply terminal VDD. The charge reset signal INITB is input to the gate of the PMOS transistor P1. The source of the PMOS transistor P1 is connected to the power-supply terminal VDD.

The frequency setting capacitor C is connected between the output terminal of the ramp-and-hold circuit 11 and the ground terminal. Further, the frequency setting capacitor C generates a frequency detection voltage Vcap according to the accumulated charge amount. Note that the frequency detection voltage Vcap is generated at the node on the output terminal side of the ramp-and-hold circuit 11.

When the charge reset signal INITB becomes an enabled state (e.g., low level), the ramp-and-hold circuit 11 turns on the PMOS transistor P1. Further, the ramp-and-hold circuit 11 resets the charge accumulated in the frequency setting capacitor C by accumulating a charge corresponding to the power-supply voltage in the frequency setting capacitor C. Further, when the charge reset signal INITB becomes a disabled state (e.g., high level) and the ramp control signal RAMP becomes an enabled state (e.g., high level), the ramp-and-hold circuit 11 turns off the PMOS transistor P1 and turns on the NMOS transistor N3. In this way, the ramp-and-hold circuit 11 draws a charge from the frequency setting capacitor C by the charge/discharge current. Further, when the ramp control signal RAMP becomes a disabled state (e.g., low level) and the hold control signal HOLD becomes an enabled state (e.g., high level), the ramp-and-hold circuit 11 turns off the NMOS transistor N3 and turns on the NMOS transistor N4. In this way, the ramp-and-hold circuit 11 stops the discharge from the frequency setting capacitor C and maintains the frequency detection voltage Vcap generated by the charge accumulated in the frequency setting capacitor C.

The differential amplifier 20 continuously changes an oscillating frequency setting current Icp according to a voltage difference between the frequency detection voltage Vcap and a reference voltage Vres and outputs the resultant oscillating frequency setting current Icp to the filter capacitor. More specifically, the differential amplifier 20 includes an amplification unit 21 and a switch circuit 22. Further, the frequency detection voltage Vcap is input to the inverting input terminal of the amplification unit 21, and the reference voltage Vres is input to the non-inverting input terminal. The amplification unit 21 is a transconductance amplifier, for example, and outputs an oscillating frequency setting current Icp having a current value corresponding to the voltage difference between the frequency detection voltage Vcap and the reference voltage Vres. Note that in this embodiment, the gate voltage of the NMOS transistor N1, to which the frequency setting resistor R is connected, is used as the reference voltage Vres.

The switch circuit 22 is disposed between the output terminal of the amplification unit 21 and the filter capacitor Cpump, and its conductive state is switched according to a pump control signal PULSE included in the timing control signals. More specifically, when the pump control signal PULSE is in an enabled state (e.g., high level), the switch circuit 22 becomes a conductive state, whereas when the pump control signal PULSE is in a disabled state (e.g., low level), the switch circuit 22 becomes a cut-off state.

Figure 2:
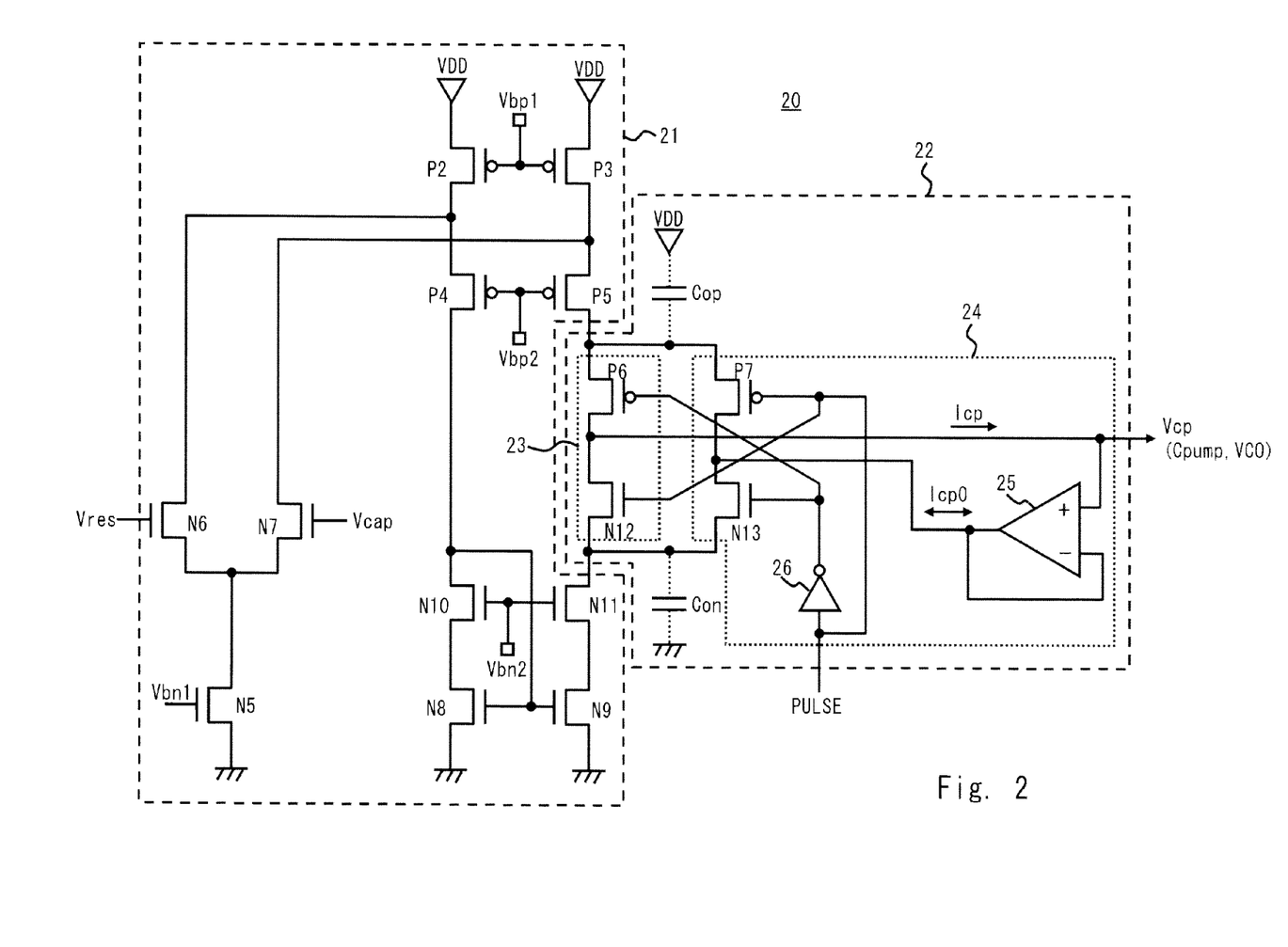
FIG. 2 is a circuit diagram of a differential amplifier in accordance with a first embodiment of the present invention.

The circuit of the differential amplifier 20 is explained hereinafter in detail. FIG. 2 shows the detailed circuit diagram of the differential amplifier 20. As shown in FIG. 2, the differential amplifier 20 includes the amplification unit 21 and the switch circuit 22.

The differential amplifier 20 forms a folded-cascode amplifier. More specifically, the differential amplifier 20 includes NMOS transistors N5 to N11 and PMOS transistors P2 to P5. The source of the NMOS transistor N5 is connected to a ground terminal, and a constant voltage Vbn1 is input to the gate of the NMOS transistor N5. The NMOS transistors N6 and N7 forms a differential pair, and they operate based on an operating current output from the NMOS transistor N5. The reference voltage Vres is input to the gate of the NMOS transistor N6, and the frequency detection voltage Vcap is input to the gate of the NMOS transistor N7. Further, the drain of the NMOS transistor N6 is connected to the drain of the PMOS transistor P2, and the drain of the NMOS transistor N7 is connected to the drain of the PMOS transistor P3.

The sources of the PMOS transistors P2 and P3 are connected to a power-supply terminal VDD. Further, a constant voltage Vbp1 is input to the gates of PMOS transistors P2 and P3. The source of the PMOS transistor P4 is connected to the drain of the PMOS transistor P2, and the source of the PMOS transistor P5 is connected to the drain of the PMOS transistor P3. A constant voltage Vbp2 is input to the gates of the PMOS transistors P4 and P5. Further, the drain of the PMOS transistor P5 serves as the flow-out-side output terminal of the oscillating frequency setting current Icp.

The sources of the NMOS transistors N8 and N9 are connected to the ground terminal. Further, the gate of the NMOS transistors N8 and N9 are connected to each other. The source of the NMOS transistor N10 is connected to the drain of the NMOS transistor N8, and the source of the NMOS transistor N11 is connected to the drain of the NMOS transistor N9. A constant voltage Vbn2 is input to the gates of the NMOS transistors N10 and N11. The drain of the NMOS transistor N10 is connected to the drain of the PMOS transistor P4 and to the gates of the NMOS transistors N8 and N9. Further, the drain of the NMOS transistor N11 serves as the flow-in-side output terminal of the oscillating frequency setting current Icp.

The switch circuit 22 includes a first switch circuit 23 and a second switch circuit 24. The first switch circuit 23 switches the conductive states between the output terminal of the amplification unit 21 and the filter capacitor Cpump according to the pump control signal PULSE. The first switch circuit 23 includes a PMOS transistor P6 and an NMOS transistor N12. One of the source and the drain terminals of the PMOS transistor P6 and one of the source and the drain terminals of the NMOS transistor N12 are connected to a node to which the filter capacitor Cpump and the voltage control oscillator 30 are connected. Further, the other of the source and the drain terminals of the PMOS transistor P6 is connected to the drain of the PMOS transistor P5 (e.g., flow-out-side output terminal). Meanwhile, the other of the source and the drain terminals of the NMOS transistor N12 is connected to the drain of the NMOS transistor N11 (e.g., flow-in-side output terminal).

Further, a signal obtained by inverting the pump control signal PULSE by an inverter 26 (which is described later) is input to the gate of the PMOS transistor P6. The pump control signal PULSE is input to the gate of the NMOS transistor N12.

The second switch circuit 24 supplies the oscillating frequency control voltage Vcp to the output terminal of the amplification unit 21 and outputs a current Icp0 that cancels out the current input from/output to the output terminal of the amplification unit 21 in a period in which the first switch circuit 23 is in a cut-off state. The second switch circuit 24 includes a PMOS transistor P7, an NMOS transistor N13, a buffer circuit 25, and an inverter 26. One terminal of the PMOS transistor P7 and one terminal of the NMOS transistor N13 are connected to the output terminal of the buffer circuit 25. Further, the other terminal of the PMOS transistor P7 is connected to the drain of the PMOS transistor P5 (e.g., flow-out-side output terminal). Meanwhile, the other terminal of the NMOS transistor N13 is connected to the drain of the NMOS transistor N11 (e.g., flow-in-side output terminal). Further, the pump control signal PULSE is input to the gate of the PMOS transistor P7. The signal obtained by inverting the pump control signal PULSE by the inverter 26 is input to the gate of the NMOS transistor N12. The non-inverting input terminal of the buffer circuit 25 is connected to the filter capacitor Cpump, and the inverting input terminal is connected to the output of the buffer circuit 25.

When the pump control signal PULSE is in an enabled state (e.g. high level), the first switch circuit 23 becomes a conductive state and therefore the differential amplifier 20 outputs the oscillating frequency setting current Icp to the filter capacitor Cpump. Further, when the pump control signal PULSE is in an enabled state, the second switch circuit 24 cuts off the propagation of the current Icp0 to the output terminal of the amplification unit 21.

On the other hand, in the differential amplifier 20, when the pump control signal PULSE is in a disabled state (e.g., low level), the first switch circuit 23 becomes a cut-off state and the second switch circuit 24 supplies the current Icp0 to the output terminal of the amplification unit 21. As a result, the output terminal of the differential amplifier 20 becomes a high-impedance state as observed from the filter capacitor Cpump side. At this point, in the differential amplifier 20, a parasitic capacitance Con is formed between the drain of the NMOS transistor N11 and the ground terminal, and a parasitic capacitance Cop is formed between the drain of the PMOS transistor P5 and the power-supply terminal VDD. Because of these parasitic capacitances Con and Cop, a voltage fluctuation Vcp0 occurs in the oscillating frequency control voltage Vcp when the first switch circuit 23 is changed from the cut-off state to the conductive state. Letting Voutp and Voutn stand for the drain voltages of the PMOS transistor P5 and the NMOS transistor N11 respectively, this voltage fluctuation Vcp0 is expressed by Equation (1) shown below.

$$Vcp0 = ((Voutp - Vcp)Cop - (Voutn - Vcp)Con)/Cpump \quad (1)$$

As can be seen from Equation (1), if the relation Vcp=Voutn=Voutp is satisfied, no voltage fluctuation Vcp0 will occur. Therefore, in the differential amplifier 20, in the period in which the first switch circuit 23 is in a cut-off state, the second switch circuit 24 absorbs the current output by the amplification unit 21 by using the buffer circuit 25 and supplies the oscillating frequency control voltage Vcp to the output terminal of the amplification unit 21. In this way, the differential amplifier 20 satisfies the condition of Vcp=Voutn=Voutp in the state where the first switch circuit 23 is in a cut-off state and thereby suppresses the voltage fluctuation Vcp0. Note that the voltage fluctuation like this is called "charge share". In the oscillator circuit 1 in accordance with an aspect of the present invention, the oscillating frequency of the output signal Fout is determined by the voltage level of the oscillating frequency control voltage Vcp. Therefore, by suppressing the voltage fluctuation in the oscillating frequency control voltage Vcp, the jitter in the output signal Fout is lowered.

The filter capacitor Cpump generates the oscillating frequency control voltage Vcp according to the charge amount that is accumulated based on the oscillating frequency setting current Icp. One end of the filter capacitor Cpump is connected to the node that connects the output terminal of the differential amplifier 20 to the input terminal of the voltage control oscillator 30, and the other end of the filter capacitor Cpump is connected to the ground terminal. That is, the filter capacitor Cpump generates the oscillating frequency control voltage Vcp according to the oscillating frequency setting current Icp output by the differential amplifier 20 and supplies the generated oscillating frequency control voltage Vcp to the voltage control oscillator 30.

The voltage control oscillator 30 controls the oscillating frequency of the output signal Fout according to the voltage level of the oscillating frequency control voltage Vcp.

The control circuit 40 generates timing control signals whose logic levels are switched based on the period of the output signal Fout. The timing control signals includes a charge reset signal INITB, a ramp control signal RAMP, a hold control signal HOLD, and a hold control signal PULSE. The control circuit 40 generates a frequency-divided signal obtained by dividing the frequency of the output signal Fout, and switches the logical levels of the above-described control signals based on a count value obtained by counting the clocks of the frequency-divided signal. Details of the logic level switching timing of the timing control signals are explained later.

Figure 3:
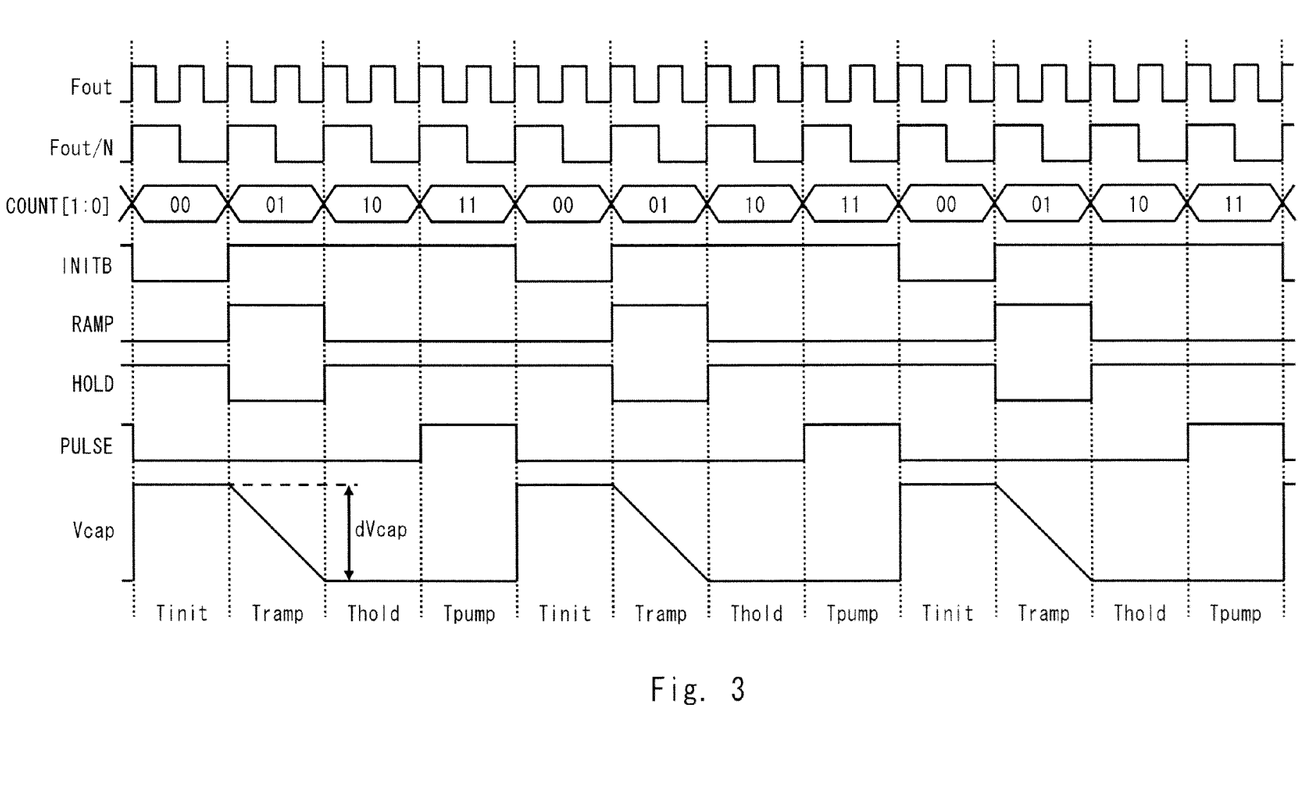
FIG. 3 is a timing chart showing operations of a control circuit and a frequency detection circuit in accordance with a first embodiment of the present invention.

Next, FIG. 3 shows a timing chart showing operations of the frequency detection circuit 10 and the control circuit 40. Further, the logic level switching timing of the timing control signals performed by the control circuit 40 as well as an operation of the frequency detection circuit 10 are explained with reference to FIG. 3.

As shown in FIG. 3, the control circuit 40 divides the frequency of the output signal Fout to generate a frequency-divided signal FD. In the example shown in FIG. 3, the frequency-divided signal FD is generated by dividing the frequency of the output signal Fout by two. Further, the control circuit 40 counts the clocks of the frequency-divided signal FD to generate a count value COUNT. In the example shown in FIG. 3, the count value COUNT is a 2-bit value and takes on a value from 0 to 3. Further, the control circuit 40 switches the logic levels of the timing control signals according to the value of the count value COUNT.

Specifically, when the count value is 0, the control circuit 40 brings the charge reset signal INITB to a low level (enabled state), brings the ramp control signal RAMP to a low level (disabled state), brings the hold control signal HOLD to a high level (enabled state), and brings the pump control signal PULSE to a low level (disabled state). In the following explanation, the period in which the count value is 0 is referred to as "charge reset period Tinit".

When the count value is 1, the control circuit 40 brings the charge reset signal INITB to a high level (disabled state), brings the ramp control signal RAMP to a high level (enabled state), brings the hold control signal HOLD to a low level (disabled state), and brings the pump control signal PULSE to a low level (disabled state). Hereinafter, the period in which the count value is 1 is referred to as "ramp period Tramp".

When the count value is 2, the control circuit 40 brings the charge reset signal INITB to a high level (disabled state), brings the ramp control signal RAMP to a low level (disabled state), brings the hold control signal HOLD to a high level (enabled state), and brings the pump control signal PULSE to a low level (disabled state). Hereinafter, the period in which the count value is 2 is referred to as "hold period Thold".

When the count value is 3, the control circuit 40 brings the charge reset signal INITB to a high level (disabled state), brings the ramp control signal RAMP to a low level (disabled state), brings the hold control signal HOLD to a high level (enabled state), and brings the pump control signal PULSE to a high level (enabled state). Hereinafter, the period in which the count value is 3 is referred to as "pump period Tpump".

Next, an operation of the frequency detection circuit 10 is explained. In the charge reset period Tinit, the frequency detection circuit 10 brings the PMOS transistor P1 into conduction based on the charge reset signal INITB, and by doing so, resets the charge accumulated in the frequency setting capacitor C to a charge amount corresponding to the power-supply voltage. As a result, the frequency detection voltage Vcap becomes a voltage substantially equal to the power-supply voltage. At this point, the NMOS transistor N3 is turned off according to the ramp control signal RAMP, and the NMOS transistor N4 is turned on according to the hold control signal HOLD.

Then, in the ramp period Tramp, the frequency detection circuit 10 turns off the PMOS transistor P1 according to the charge reset signal INITB, turns on the NMOS transistor N3 according to the ramp control signal RAMP, and turns off the NMOS transistor N4 according to the hold control signal HOLD. That is, in the ramp period Tramp, the frequency detection circuit 10 draws a charge from the frequency setting capacitor C based on the charge/discharge current. As a result, the voltage level of the frequency detection voltage Vcap gradually decreases. The slope along which the frequency detection voltage Vcap decreases is determined by the magnitude of the charge/discharge current and the capacitance of the frequency setting capacitor C. Further, in the ramp period Tramp, the voltage level of the frequency detection voltage Vcap decreases at a constant voltage decrease rate. Therefore, the voltage decrease amount dVcap of the frequency detection voltage Vcap in the ramp period Tramp is determined by the length of the ramp period Tramp (oscillating frequency of the output signal Fout).

Then, in the hold period Thold, the frequency detection circuit 10 turns off the PMOS transistor P1 according to the charge reset signal INITB, turns off the NMOS transistor N3 according to the ramp control signal RAMP, and turns on the NMOS transistor N4 according to the hold control signal HOLD. That is, in the hold period Thold, the frequency detection circuit 10 brings the node connected to the frequency setting capacitor C into a high-impedance state and maintains the voltage level of the frequency detection voltage Vcap generated by the frequency setting capacitor C.

Then, in the pump period Tpump, the differential amplifier 20 supplies the oscillating frequency setting current Icp to the filter capacitor Cpump. Note that the states of the charge reset signal INITB, the ramp control signal RAMP, and the hold control signal HOLD supplied to the frequency detection circuit 10 are the same between during the hold period Thold and during the pump period Tpump. Therefore, the voltage level of the frequency detection voltage Vcap is never changed by the frequency detection circuit 10 during the pump period Tpump.

Figure 4:
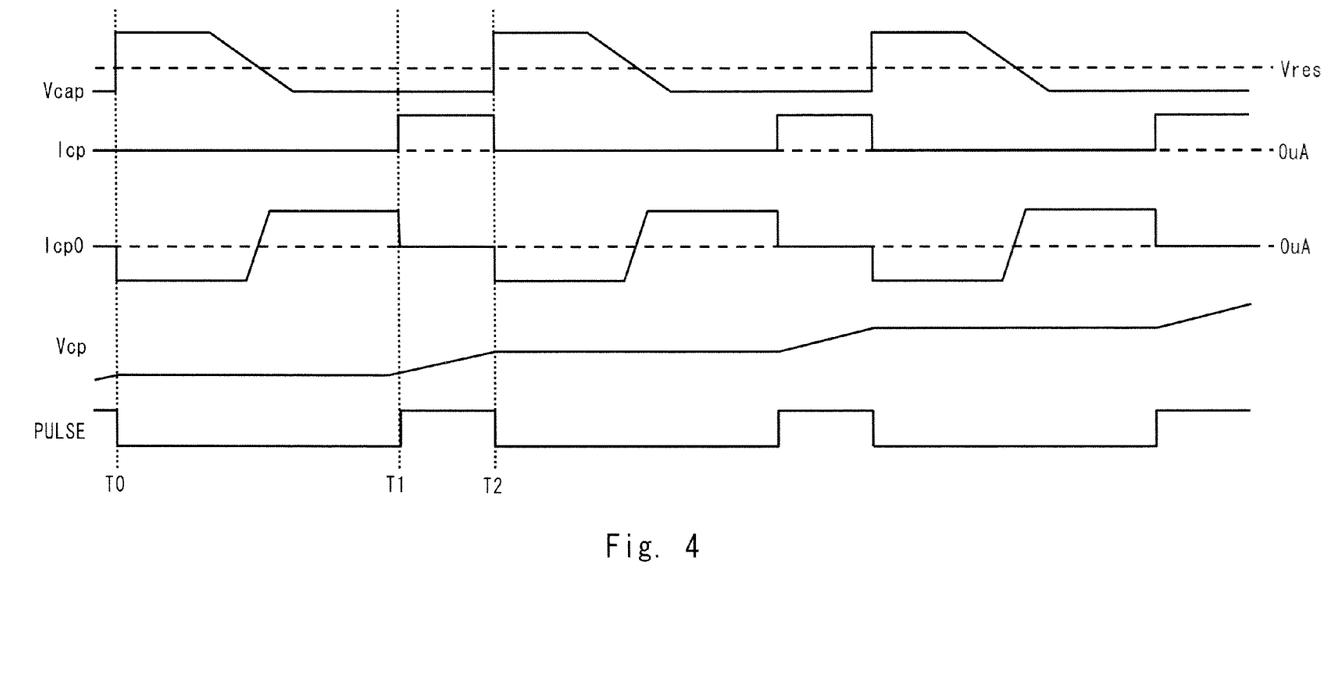
FIG. 4 is a timing chart showing an operation of a differential amplifier in accordance with a first embodiment of the present invention.

Next, an operation of the differential amplifier 20 explained. FIG. 4 shows a timing chart showing an operation of the differential amplifier 20. In the example shown in FIG. 4, the period from a timing T0 to T2 corresponds to a set of periods consisting of the charge reset period Tinit, the ramp period Tramp, the hold period Thold, and the pump period Tpump shown in FIG. 3. Further, the period from the timing T1 to T2 corresponds to the pump period shown in FIG. 3.

The differential amplifier 20 outputs the current Icp according to a voltage difference between the frequency detection voltage Vcap and the reference voltage Vres, However, in the period from the timing T0 to T1, the pump control signal PULSE is in a disabled state (low level). Therefore, the first switch circuit 23 becomes a cut-off state and the frequency detection voltage Vcap is thereby kept unchanged. Meanwhile, the amplification unit 21 outputs a current according to a voltage difference between the frequency detection voltage Vcap and the reference voltage Vres. However, the second switch circuit 24 outputs the current Icp0 that cancels out the current output by the amplification unit 21, so that the output voltage of the amplification unit 21 is brought to the voltage Vcp.

Then, when the pump control signal PULSE becomes an enabled state (e.g., high level) at the timing T1, the first switch circuit 23 becomes a conductive state and the second switch circuit 24 becomes a cut-off state. As a result, the differential amplifier 20 outputs the current Icp to the filter capacitor Cpump according to the voltage difference between the frequency detection voltage Vcap and the reference voltage Vres, and therefore the oscillating frequency control voltage Vcp changes. In the example shown in FIG. 4, since the oscillating frequency setting current Icp is output with a positive polarity (direction to charge the filter capacitor Cpump), the frequency detection voltage Vcap rises during the period from the timing T1 to T2.

Figure 5:
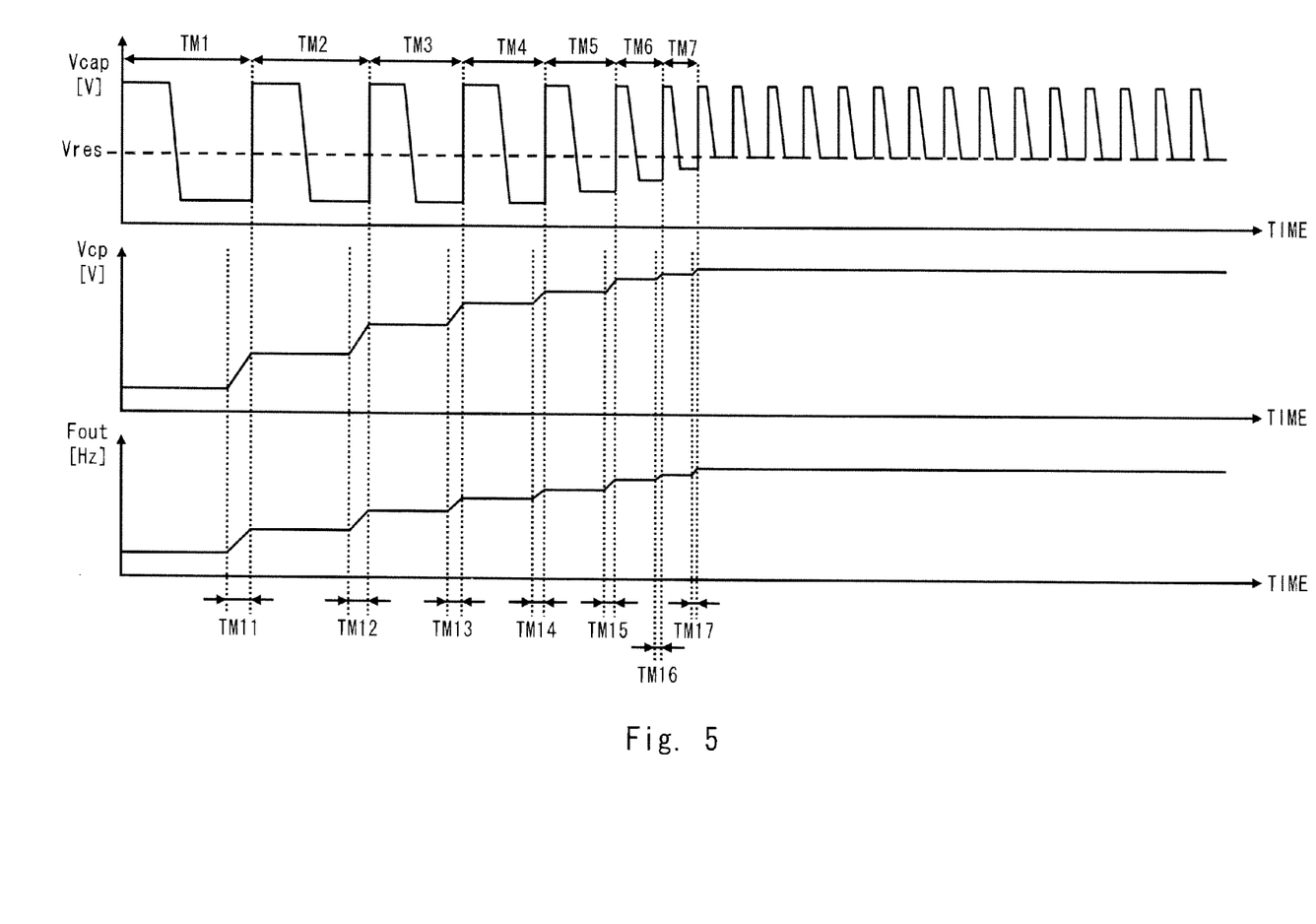
FIG. 5 is a timing chart showing an operation of an oscillator circuit in accordance with a first embodiment of the present invention.

Next, an overall operation of the oscillator circuit 1 in accordance with the first embodiment is explained. FIG. 5 shows a timing chart showing an operation of the oscillator circuit 1 in accordance with the first embodiment. In the timing chart shown in FIG. 5, only the frequency detection voltage Vcap, the oscillating frequency control voltage Vcp, and the output signal Fout are shown. Further, assume that the oscillator circuit 1 starts to operate at the origin of the time axis (horizontal axis) in FIG. 5.

As shown in FIG. 5, the oscillator circuit 1 increases the oscillating frequency control voltage Vcp in each of the periods TM1 to TM7. In each of the periods TM1 to TM7, a set of periods consisting of the charge reset period Tinit, the ramp period Tramp, the hold period Thold, and the pump period Tpump shown in FIG. 3 is included. Further, since the frequency of the output signal Fout increases in each period, the period becomes gradually shorter from one period to another in the periods TM1 to TM7. This is because the timing control signals are generated based on the period of the output signal Fout. Note that each of the periods TM11 to TM17 shown in FIG. 5 becomes a period corresponding to the pump period Tpump.

Then, after the period TM7, the low-level-side voltage of the frequency detection voltage Vcap becomes substantially equal to the reference voltage Vres. As a result, in the oscillator circuit 1, the oscillating frequency setting current Icp output by the differential amplifier 20 becomes substantially zero. Therefore, after the low-level-side voltage of the frequency detection voltage Vcap becomes substantially equal to the reference voltage Vres, the state of the oscillator circuit 1 is kept unchanged. Further, since the frequency detection voltage Vcap is maintained at a constant voltage, the oscillating frequency of the output signal Fout is also maintained at a constant frequency. That is, in the oscillator circuit 1, after the oscillating frequency of the output signal Fout reaches the target value, no jitter occurs in the output signal Fout.

As can be understood from the above explanation, in the oscillator circuit 1 in accordance with the first embodiment, the filter capacitor Cpump generates the oscillating frequency control voltage Vcp according to the oscillating frequency setting current Icp. In this process, in the oscillator circuit 1, the differential amplifier 20 outputs the oscillating frequency setting current Icp that continuously changes according to the voltage difference between the frequency detection voltage Vcap and the reference voltage Vres. That is, when there is a voltage difference between the frequency detection voltage Vcap and the reference voltage Vres, the oscillating frequency setting current Icp has a current value corresponding to that voltage difference, whereas when there is no voltage difference between the frequency detection voltage Vcap and the reference voltage Vres, the oscillating frequency setting current Icp becomes substantially zero. In this way, in the oscillator circuit 1, in the state where the frequency of the output signal Fout matches the target value (for example, state where the frequency detection voltage Vcap matches the reference voltage Vres), no fluctuation occurs in the oscillating frequency control voltage Vcp even when the pump control signal PULSE becomes an enabled state. As a result, in the oscillator circuit 1, the voltage value of the oscillating frequency control voltage Vcp never fluctuates after the oscillating frequency of the output signal Fout matches the target value. Therefore, the oscillating frequency of the output signal Fout, which is determined by the voltage control oscillator 30 according to the voltage value of the oscillating frequency control voltage Vcp, also never deviates. That is, in the oscillator circuit 1, the jitter in the output signal Fout can be lowered.

Further, in the oscillator circuit 1 in accordance with the first embodiment, the differential amplifier 20 includes the switch circuit 22. This switch circuit 22 is controlled to a cut-off state in all periods other than the period in which the difference voltage amplification result of the input signal of the differential amplifier 20 is reflected (e.g., pump period Tpump). In the oscillator circuit 1, the frequency detection voltage Vcap has a voltage value deviated from the voltage reflecting the output signal Fout in the charge reset period Tinit and the ramp period Tramp. However, since the switch circuit 22 is controlled to a cut-off state in all periods other than the pump period, the deviation of the frequency detection voltage Vcap in the charge reset period Tinit and the ramp period Tramp can be prevented from being reflected on the oscillating frequency. In this way, in the oscillator circuit 1, the oscillating frequency can be stabilized in any of these periods.

Further, in the oscillator circuit 1, the switch circuit 22 includes the first switch circuit 23 and the second switch circuit 24. Further, even in the period in when the first switch circuit 23 is in a cut-off state, the second switch circuit 24 is operated for the output terminal of the amplification unit 21. The second switch circuit 24 absorbs the current output from the amplification unit 21 and thereby maintains the output terminal of the amplification unit 21 at the oscillating frequency control voltage Vcp even in the charge reset period Tinit and the ramp period Tramp in which a voltage difference occurs between the frequency detection voltage Vcap and the reference voltage Vres. As a result, it is possible to suppress the potential fluctuation in the oscillating frequency control voltage Vcp resulting from the charge share that occurs at the timing when the first switch circuit 23 changes from a cut-off state to a conductive state. That is, in the oscillator circuit 1 in accordance with the first embodiment, it is possible to suppress the jitter that is caused as a result of the provision of the switch circuit 22.

In the oscillator circuit 1 in accordance with the first embodiment, the diode voltage of the NMOS transistor N1 is used as the reference voltage Vres and the current value of the charge/discharge current is determined by dividing the difference voltage between the power-supply voltage and that diode voltage by the frequency setting resistance R. When the diode voltage becomes lower, the current value of the charge/discharge current becomes larger. Therefore, the inclination of the frequency detection voltage Vcap in the ramp period Tramp becomes larger. The current value Ires of the charge/discharge current is expressed by Equation (2) shown below by using the frequency setting resistance R, the reference voltage Vres, and the power-supply voltage VDD.

$$Ires=(VDD-Vres)/R \qquad (2)$$

When the frequency detection voltage in the hold period Thold is represented as Vcap(HOLD), it is expressed by Equation (3) shown below:

$$Vcap(HOLD)=VDD-(Ires \cdot Tramp)/C \qquad (3)$$

where Ires is the current value of the charge/discharge current; C is the capacitance of the frequency setting capacitor C; and Tramp is the length of the ramp period. Note that in the oscillator circuit 1 in accordance with the first embodiment, the frequency is corrected by the feedback loop so that the relation "Vcap(HOLD)=Vres" is satisfied. Therefore, by obtaining the ramp period Tramp and the frequency of the output signal Fout from Equations (2) and (3), Equation (4) shown below is obtained. Note that in Equation (4), N represents the number of frequency-divisions in the control circuit 40.

$$Fout=N/Tramp=N/RC \qquad (4)$$

That is, in the oscillator circuit 1 in accordance with the first embodiment, the power-supply voltage and the diode voltage of the NMOS transistor N1 are cancelled out. Therefore, it is expressed by a function consisting of only the frequency setting resistance R, the frequency setting capacitance C, and the number of frequency-divisions N.

Second Embodiment

In a second embodiment in accordance with the present invention, a different method for controlling timing control signals in the control circuit 40 is explained. In the second embodiment, the pump period Tpump is controlled so that the length of the pump period Tpump becomes longer than the other periods in the early stage of the starting process of the oscillator circuit 1. Therefore, FIG. 6 shows a timing chart showing an operation of an oscillator circuit 1 in accordance with the method for controlling timing control signals in accordance with the second embodiment.

Figure 6:
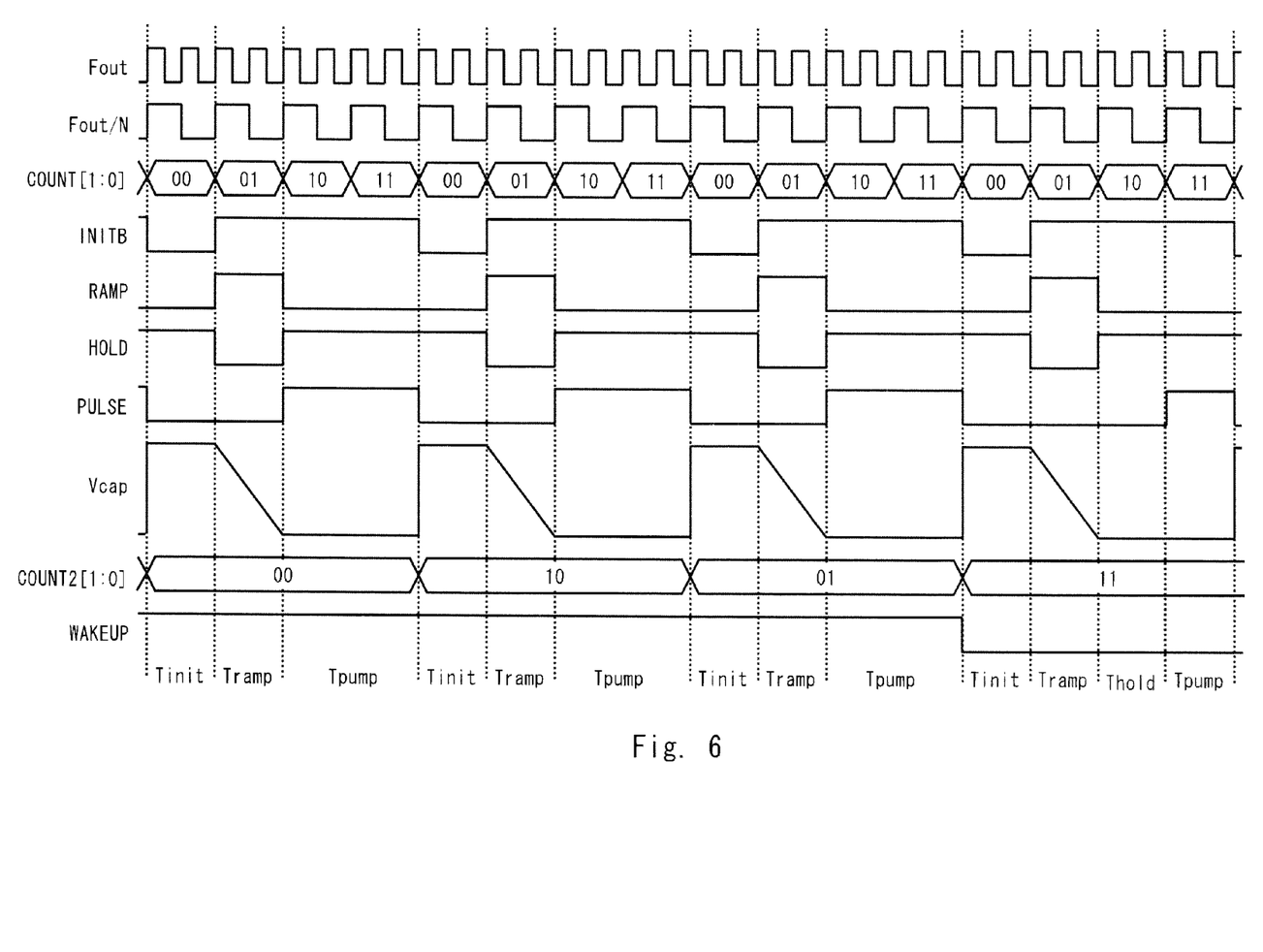
FIG. 6 is a timing chart showing operations of a control circuit and a frequency detection circuit in accordance with a second embodiment of the present invention.

As shown in FIG. 6, the oscillator circuit 1 in accordance with the second embodiment includes a second counter in the control circuit 40. The second counter counts falling edges of the charge reset signal INITB. Further, the control circuit 40 in accordance with the second embodiment brings a wake-up signal WAKEUP to a high level in a period in which a second count value generated by the second counter is equal to or less than two (e.g., "01"). Further, in the period in which the wake-up signal WAKEUP is in a high level, the control circuit 40 brings the pump control signal PULSE into an enabled state (e.g., high level) even in the period corresponding to the hold period Thold.

Note that once the second count value reaches three (e.g., "11"), it is maintained at that value until the reset signal (not shown) becomes an enabled state. That is, in the second embodiment, after the reset signal becomes a disabled state (e.g., low level) and the oscillator circuit 1 starts to operate, the control circuit 40 prolongs the pump period Tpump for a predetermined period and thereby increases the charging time of the filter capacitor Cpump. In this way, in the oscillator circuit 1 in accordance with the second embodiment, the rising speed of the oscillating frequency immediately after the startup becomes faster compared to that of the oscillator circuit 1 in accordance with the first embodiment.

Figure 7:
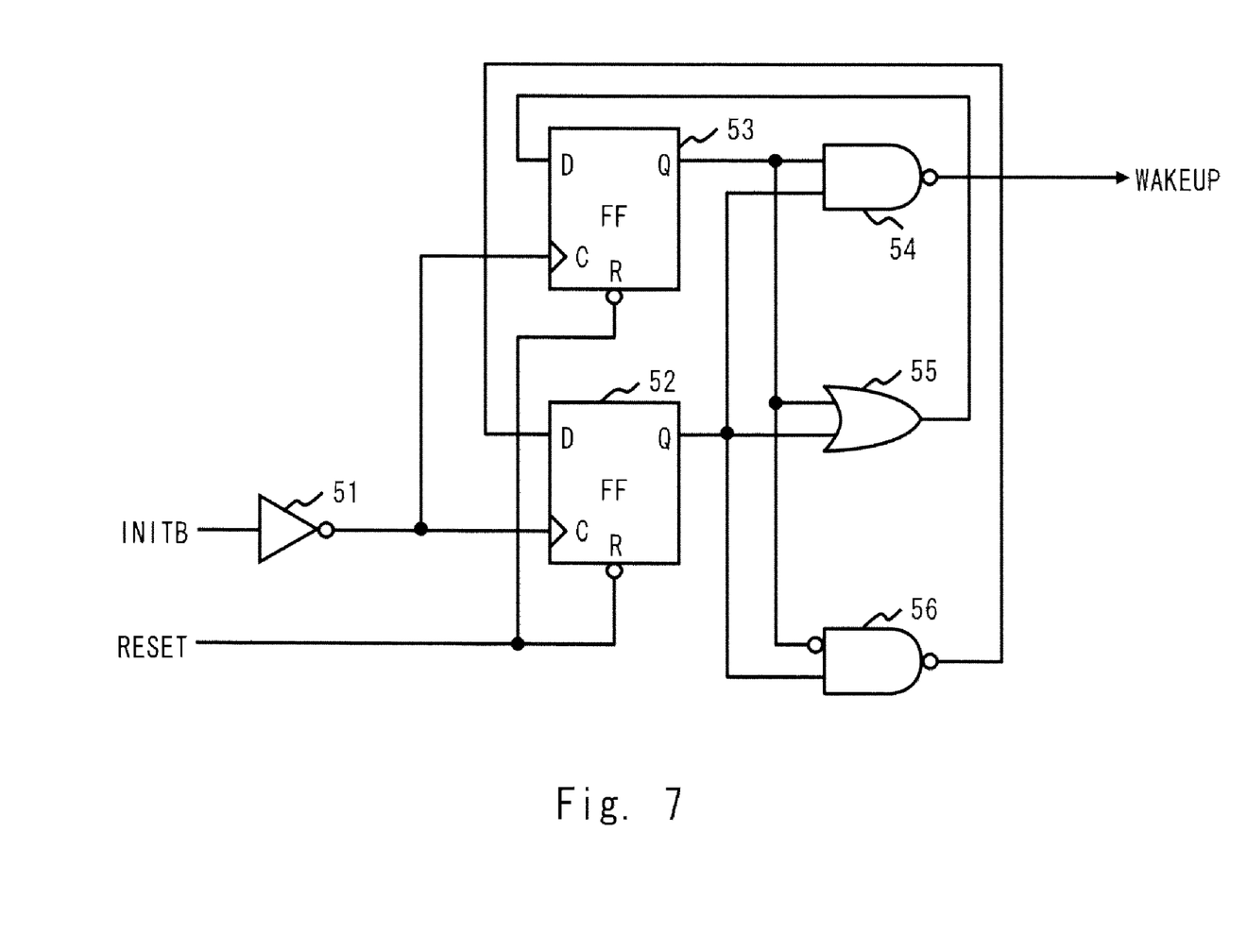
FIG. 7 is a circuit diagram showing an example of a circuit that generates a start signal among timing control signals in accordance with a second embodiment of the present invention.

FIG. 7 shows a circuit diagram of a wake-up signal generation circuit that generates a wake-up signal WAKEUP. As shown in FIG. 7, the wake-up signal generation circuit includes an inverter circuit 51, D-flip-flop circuits 52 and 53, a NAND circuit 54, an OR circuit 55, and a NAND circuit with an inverting input 56.

The inverter circuit 51 inverts the charge reset signal INITB and supplies the inverted signal to the clock input terminals of the D-flip-flop circuits 52 and 53. The D-flip-flop circuit 52 receives a reset signal RESET at the reset terminal, brings the output terminal Q to a reset state (e.g., low level) in a period in which the reset signal RESET is at a low level, and holds the logic level of a signal that is input to the input terminal D at a falling edge of the charge reset signal INITB in a period in which the reset signal RESET is at a high level. An output signal of the NAND circuit with an inverting input 56 is input to the input terminal D of the D-flip-flop circuit 52. The D-flip-flop circuit 53 receives the reset signal RESET at the reset terminal, brings the output terminal Q to a reset state (e.g., low level) in a period in which the reset signal RESET is at a low level, and holds the logic level of a signal that is input to the input terminal D at a falling edge of the charge reset signal INITB in a period in which the reset signal RESET is at a high level. An output signal of the OR circuit 55 is input to the input terminal D of the D-flip-flop circuit 53.

The output signals of the D-flip-flop circuits 52 and 53 are input to the NAND circuit 54. Then, the NAND circuit 54 outputs the logical multiplication value of these two input signals as a wake-up signal WAKEUP. Further, the output signals of the D-flip-flop circuits 52 and 53 are also input to the OR circuit 55. Then, the OR circuit 55 outputs the logical sum value of these two input signals to the D-flip-flop circuit 53. The output signals of the D-flip-flop circuits 52 and 53 are also input to the NAND circuit with an inverting input 56. Then, the NAND circuit with an inverting input 56 outputs the inverted logical multiplication value of the inverted logical value of the output signal of the D-flip-flop circuit 53 and the logical value of the output signal of the D-flip-flop circuit 52 to the D-flip-flop circuit 52

The wake-up signal generation circuit forms a 2-bit second counter by the D-flip-flop circuits 52 and 53, the OR circuit 55, and the NAND circuit with an inverting input 56. Further, each of the OR circuit 55 and the NAND circuit with an inverting input 56 outputs "1" (e.g., high level) as an output signal when the outputs of the D-flip-flop circuits 52 and 53 both become "1" (e.g., high level). As a result, after the count value becomes three (e.g., 11), the wake-up signal generation circuit maintains that count value irrespective of the input value of the charge reset signal INITB.

As can be understood from the above explanation, in the oscillator circuit 1 in accordance with the second embodiment, the rising speed of the oscillating frequency in the early stage of the starting process becomes faster compared to that of the oscillator circuit 1 in accordance with the first embodiment. As a result, in the oscillator circuit 1 in accordance with the second embodiment, it is possible to reduce the time required before the frequency of the output signal Fout is locked.

Third Embodiment

Figure 8:
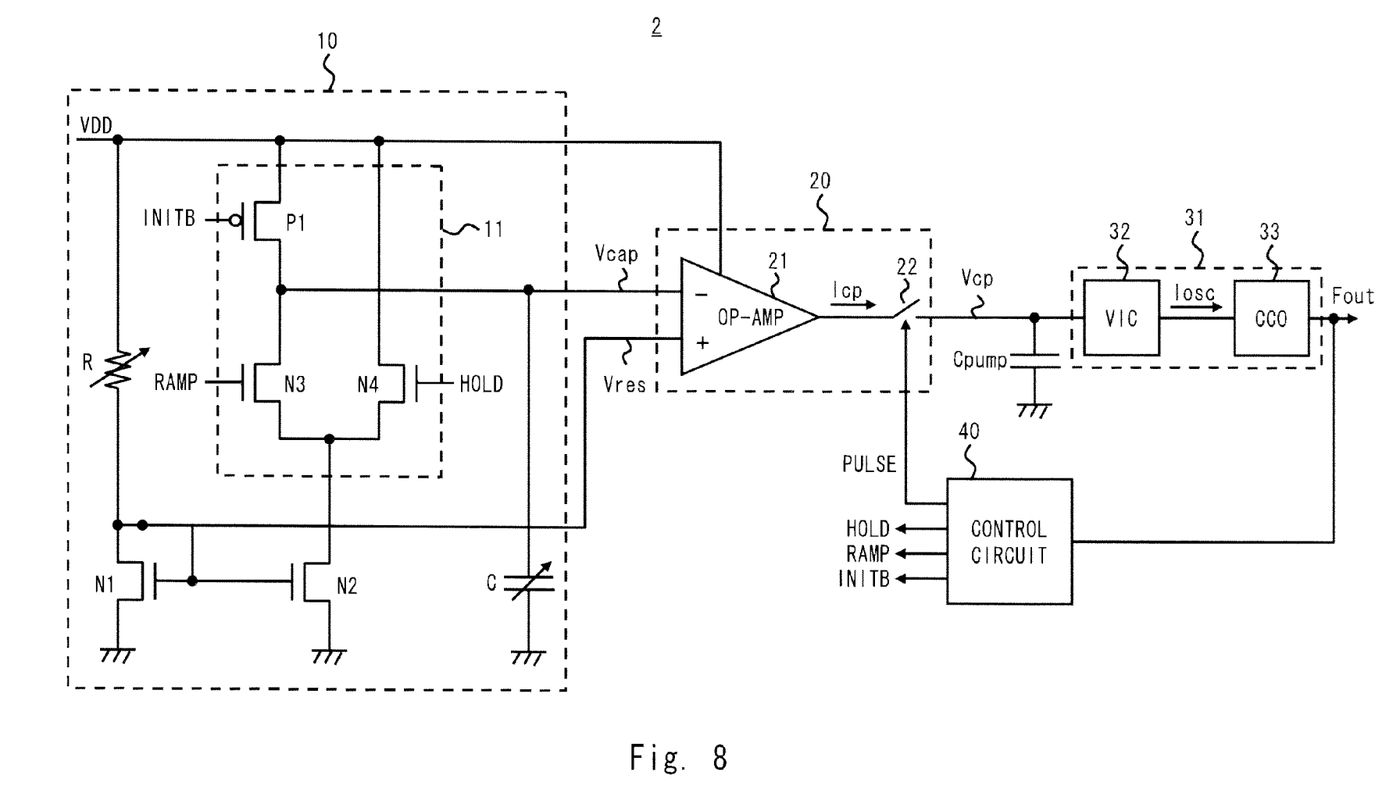
FIG. 8 is a block diagram of an oscillation signal in accordance with a third embodiment of the present invention.

FIG. 8 shows a block diagram of an oscillator circuit 2 in accordance with a third embodiment of the present invention. As shown in FIG. 8, the oscillator circuit 2 uses an oscillator 31 in place of the oscillator 30. The oscillator 31 uses a voltage-current conversion circuit 32 and a current control oscillator 33. The current control oscillator 33 controls the frequency of the output signal Fout by using a control current Iosc. In the example shown in FIG. 8, the control current Iosc is generated by the voltage-current conversion circuit 32. The voltage-current conversion circuit 32 generates a control current Iosc corresponding to the voltage level of the oscillating frequency control voltage Vcp.

That is, the oscillator circuit 2 realizes an operation equivalent to that of the oscillator circuit 1 by generating a control current Iosc corresponding to the oscillating frequency control voltage Vcp and controlling the frequency of the output signal Fout by the control current Iosc.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. An oscillator circuit comprising:
   a filter capacitor that generates an oscillating frequency control voltage according to a charge amount accumulated based on an oscillating frequency setting current;
   an oscillator that changes a frequency of an oscillation signal to be output according to the voltage;
   a control circuit configured to generate a timing control signal, a logic level of the timing control signal being switched based on a period of the oscillation signal;
   a frequency detection circuit, having an output terminal, that generates a frequency detection voltage based on the timing control signal, a voltage level of the frequency detection voltage being changed according to a length of the period of the oscillation signal; and
   a differential amplifier, having an output terminal, that continuously changes the oscillating frequency setting current according to a voltage difference between the frequency detection voltage and a reference voltage, and outputs the resultant oscillating frequency setting current to the filter capacitor,
   wherein the timing control signal includes a charge reset signal, a ramp control signal, and a hold control signal, all of which are supplied to the frequency detection circuit, and
   wherein the control circuit is configured to:
      in a charge reset period, resets a charge of a frequency setting capacitor by switching the charge reset signal to an enabled state, the frequency setting capacitor connected to the output terminal of the frequency detection circuit;
      in a ramp period, supplies the charge/discharge current to the frequency setting capacitor by switching the ramp control signal to an enabled state; and
      in a hold period, brings the output terminal of the frequency detection circuit to a high-impedance state by switching the hold control signal to an enabled state.

2. The oscillator circuit according to claim 1, wherein the differential amplifier brings the output terminal of the differential amplifier to a high-impedance state according to a pump control signal included in the timing control signal.

3. The oscillator circuit according to claim 2, wherein the control circuit is configured to set a frequency of the oscillation signal used to generate a period, during which the filter capacitor is charged/discharged from the output terminal of the differential amplifier by the pump control signal, to a higher value in a predetermined period starting from an operation start of the oscillator circuit than in other periods.

4. The oscillator circuit according to claim 3, wherein the differential amplifier is disposed between the output terminal of the frequency detection circuit and the filter capacitor, and includes a switch circuit whose conductive state is switched according to the pump control signal.

5. The oscillator circuit according to claim 4, wherein an amplification unit of the differential amplifier is formed by a folded-cascode type amplifier.

6. The oscillator circuit according to claim 4, wherein the frequency detection circuit comprises:
   a frequency setting capacitor that generates the frequency detection voltage according to an accumulated charge amount;
   a frequency setting resistor that sets a current value of a charge/discharge current of the capacitor; and
   a ramp-and-hold circuit that supplies the charge/discharge current to the frequency setting capacitor based on the timing control signal, and resets a charge accumulated in the frequency setting capacitor.

7. The oscillator circuit according to claim 6,
   wherein the frequency detection circuit comprises:
      a first transistor to which the charge/discharge current is input; and
      a second transistor that supplies the charge/discharge current to the ramp-and-hold circuit, the second transistor being connected to the first transistor in a current mirror configuration, and
   wherein the reference voltage is generated based on a diode voltage of the first transistor.

8. The oscillator circuit according to claim 4, wherein the oscillator includes either one of a voltage control oscillator and a current control oscillator.

9. The oscillator circuit according to claim 2, wherein the differential amplifier is disposed between the output terminal of the frequency detection circuit and the filter capacitor, and includes a switch circuit whose conductive state is switched according to the pump control signal.

10. The oscillator circuit according to claim 1, wherein an amplification unit of the differential amplifier is formed by a folded-cascode type amplifier.

11. The oscillator circuit according to claim 1, wherein the frequency detection circuit comprises:
   a frequency setting capacitor that generates the frequency detection voltage according to an accumulated charge amount;
   a frequency setting resistor that sets a current value of a charge/discharge current of the capacitor; and
   a ramp-and-hold circuit that supplies the charge/discharge current to the frequency setting capacitor based on the timing control signal, and resets a charge accumulated in the frequency setting capacitor.

12. The oscillator circuit according to claim 11, wherein the frequency detection circuit comprises:
   a first transistor to which the charge/discharge current is input; and
   a second transistor that supplies the charge/discharge current to the ramp-and-hold circuit, the second transistor being connected to the first transistor in a current mirror configuration, and
   wherein the reference voltage is generated based on a diode voltage of the first transistor.

13. The oscillator circuit according to claim 1, wherein the oscillator includes either one of a voltage control oscillator and a current control oscillator.

14. An oscillator circuit comprising:
   a filter capacitor that generates an oscillating frequency control voltage according to a charge amount accumulated based on an oscillating frequency setting current;
   an oscillator that changes a frequency of an oscillation signal to be output according to the oscillating frequency control voltage;
   a control circuit configured to generate a timing control signal, a logic level of the timing control signal being switched based on a period of the oscillation signal;
   a frequency detection circuit, having an output terminal, that generates a frequency detection voltage based on the timing control signal, a voltage level of the frequency detection voltage being changed according to a length of the period of the oscillation signal; and
   a differential amplifier, having an output terminal, that continuously changes the oscillating frequency setting current according to a voltage difference between the frequency detection voltage and a reference voltage, and outputs the resultant oscillating frequency setting current to the filter capacitor,
   wherein the differential amplifier brings the output terminal of the differential amplifier to a high-impedance state according to a pump control signal included in the timing control signal,
   wherein the differential amplifier is disposed between the output terminal of the frequency detection circuit and the filter capacitor, and includes a switch circuit whose conductive state is switched according to the pump control signal,
   wherein the switch circuit comprises:
      a first switch circuit that switches a conductive state between the output terminal of the differential amplifier and the filter capacitor according to the pump control signal; and
      a second switch circuit that supplies the frequency setting current to the output terminal of the differential amplifier and outputs a current used to cancel out a current input from/output to the output terminal of the differential amplifier in a period in which the first switch circuit is in a cut-off state.

15. The oscillator circuit according to claim 14, wherein an amplification unit of the differential amplifier is formed by a folded-cascode type amplifier.

16. The oscillator circuit according to claim 14, wherein the frequency detection circuit comprises:
   a frequency setting capacitor that generates the frequency detection voltage according to an accumulated charge amount;
   a frequency setting resistor that sets a current value of a charge/discharge current of the capacitor; and
   a ramp-and-hold circuit that supplies the charge/discharge current to the frequency setting capacitor based on the timing control signal, and resets a charge accumulated in the frequency setting capacitor.

17. The oscillator circuit according to claim 16, wherein the frequency detection circuit comprises:
   a first transistor to which the charge/discharge current is input; and
   a second transistor that supplies the charge/discharge current to the ramp-and-hold circuit, the second transistor being connected to the first transistor in a current mirror configuration, and
   wherein the reference voltage is generated based on a diode voltage of the first transistor.

18. The oscillator circuit according to claim 14, wherein the oscillator includes either one of a voltage control oscillator and a current control oscillator.

19. An oscillator circuit comprising:
   a filter capacitor that generates an oscillating frequency control voltage according to a charge amount accumulated based on an oscillating frequency setting current;
   an oscillator that changes a frequency of an oscillation signal to be output according to the oscillating frequency control voltage;
   a control circuit configured to generate a timing control signal, a logic level of the timing control signal being switched based on a period of the oscillation signal;
   a frequency detection circuit, having an output terminal, that generates a frequency detection voltage based on the timing control signal, a voltage level of the frequency detection voltage being changed according to a length of the period of the oscillation signal;
   a differential amplifier, having an output terminal, that continuously changes the oscillating frequency setting current according to a voltage difference between the frequency detection voltage and a reference voltage, and outputs the resultant oscillating frequency setting current to the filter capacitor,
   wherein the differential amplifier brings the output terminal of the differential amplifier to a high-impedance state according to a pump control signal included in the timing control signal,
   wherein the control circuit is configured to set a frequency of the oscillation signal used to generate a period, during which the filter capacitor is charged/discharged from an output terminal of the differential amplifier by the pump control signal, to a higher value in a predetermined period starting from an operation start of the oscillator circuit than in other periods,
   wherein the differential amplifier is disposed between the output terminal of the frequency detection circuit and the filter capacitor, and includes a switch circuit whose conductive state is switched according to the pump control signal;
   a first switch circuit that switches a conductive state between the output terminal of the differential amplifier and the filter capacitor according to the pump control signal; and
   a second switch circuit that supplies the frequency setting current to the output terminal of the differential amplifier and outputs a current used to cancel out a current input from/output to the output terminal of the differential amplifier in a period in which the first switch circuit is in a cut-off state.

* * * * *